United States Patent
Jiang et al.

(10) Patent No.: US 9,678,131 B2
(45) Date of Patent: Jun. 13, 2017

(54) METHOD AND APPARATUS FOR SHORT FAULT ISOLATION IN A CONTROLLER AREA NETWORK

(71) Applicant: GM GLOBAL TECHNOLOGY OPERATIONS LLC, Detroit, MI (US)

(72) Inventors: Shengbing Jiang, Rochester Hills, MI (US); Xinyu Du, Oakland Township, MI (US); Atul Nagose, Royal Oak, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 90 days.

(21) Appl. No.: 14/720,414

(22) Filed: May 22, 2015

(65) Prior Publication Data

US 2015/0346260 A1 Dec. 3, 2015

Related U.S. Application Data

(60) Provisional application No. 62/003,352, filed on May 27, 2014.

(51) Int. Cl.
*G01R 31/04* (2006.01)
*G01R 31/02* (2006.01)
(Continued)

(52) U.S. Cl.
CPC ......... *G01R 31/025* (2013.01); *G01R 31/006* (2013.01); *G06F 11/0739* (2013.01);
(Continued)

(58) Field of Classification Search
CPC .... G01R 31/00; G01R 31/024; G01R 31/025; G01R 31/08; G01R 31/28; G01R 31/002; G01R 31/04; G01R 31/2808; G01R 31/2818; G01R 31/31901; G01R 31/26; G01R 31/2886; G01R 31/041; G01R 27/18; G01R 1/0408; G01R 1/06; G01R 1/067; G01R 1/0433; G01R 1/0483; G01R 1/07314; G01R 1/0416; G01R 1/07378
(Continued)

(56) References Cited

U.S. PATENT DOCUMENTS 5,821,767 A * 10/1998 Osaka ................. G06F 13/4077
326/30
8,086,355 B1 * 12/2011 Stanczak .............. H02H 1/0092
323/282

(Continued)

OTHER PUBLICATIONS

CAN-Bus Troubleshooting Guide , http://www.esd-electronics-usa. com/CAN-Bus-Troubleshooting-Guide.html, 2011.*

*Primary Examiner* — Patrick Assouad
*Assistant Examiner* — Demetrius Pretlow

(57) ABSTRACT

A controller area network (CAN) includes a CAN bus having a CAN-H wire, a CAN-L wire, and a pair of CAN bus terminators located at opposite ends of the CAN bus. The CAN further includes a plurality of nodes including controllers wherein at least one of the controllers is a monitoring controller. The monitoring controller includes a detection control routine for isolating faults on the CAN bus including measuring a CAN-H wire voltage, measuring a CAN-L wire voltage, and isolating a short fault based upon the CAN-H wire voltage and the CAN-L wire voltage.

12 Claims, 5 Drawing Sheets

(51) Int. Cl.
   *G01R 31/00* (2006.01)
   *G06F 11/30* (2006.01)
   *G06F 11/34* (2006.01)
   *G06F 11/07* (2006.01)

(52) U.S. Cl.
   CPC ...... *G06F 11/0793* (2013.01); *G06F 11/3013* (2013.01); *G06F 11/349* (2013.01)

(58) Field of Classification Search
   USPC ............... 324/500, 509, 512, 537, 538, 555, 324/756.01, 756.05; 361/42, 54; 439/34, 439/251, 921, 949; 702/1, 57, 58, 59
   See application file for complete search history.

(56) References Cited

U.S. PATENT DOCUMENTS

| | | | | |
|---|---|---|---|---|
| 2004/0153223 | A1* | 8/2004 | Fujita | H04L 41/0677 701/29.6 |
| 2004/0153707 | A1* | 8/2004 | Ellerbrock | H04L 41/0681 714/4.2 |
| 2008/0186870 | A1* | 8/2008 | Butts | H04L 41/0659 370/252 |
| 2009/0183033 | A1* | 7/2009 | Ando | H04L 43/0823 714/43 |
| 2011/0130916 | A1* | 6/2011 | Mayer | G07C 5/008 701/31.4 |
| 2012/0155285 | A1* | 6/2012 | Smart | H04L 12/2697 370/242 |
| 2014/0355452 | A1* | 12/2014 | Nii | H04L 41/0631 370/242 |
| 2015/0009598 | A1* | 1/2015 | Trombetti | G01R 31/08 361/86 |

* cited by examiner

US 9,678,131 B2

METHOD AND APPARATUS FOR SHORT FAULT ISOLATION IN A CONTROLLER AREA NETWORK

CROSS REFERENCE TO RELATED APPLICATIONS

This application claims the benefit of U.S. Provisional Application No. 62/003,352, filed on May 27, 2014, which is incorporated herein by reference.

TECHNICAL FIELD

This disclosure relates to fault isolation for communications in controller area networks.

BACKGROUND

The statements in this section merely provide background information related to the present disclosure. Accordingly, such statements are not intended to constitute an admission of prior art.

Vehicle systems include a plurality of subsystems, including by way of example, engine, transmission, ride/handling, braking, HVAC, and occupant protection. Multiple controllers may be employed to monitor and control operation of the subsystems. The controllers can be configured to communicate via a controller area network (CAN) to coordinate operation of the vehicle in response to operator commands, vehicle operating states, and external conditions. A fault can occur in one of the controllers that affects communications via a CAN bus.

Topology of a network such as a CAN refers to a connective arrangement among network elements, and preferably includes a plurality of nodes having interconnected or dispersed power, ground or communications links. A physical topology describes arrangement or layout of physical elements including links and nodes, wherein nodes include controllers and other connected devices and links include either power, ground or communications links in the form of suitable cables, wires, printed wiring boards (PWBs), printed circuit boards (PCBs), flexible strips, and the like. A logical topology describes flow of data messages, power or grounding within a network between nodes employing power, ground or communications links. Known CAN systems employ a bus topology for the communication connection among all the controllers that can include a linear topology, a star topology, or a combination of star and linear topologies. Known CAN systems employ separate power and ground topologies for the power and ground lines to all the controllers. Known controllers communicate with each other through messages that are sent at different periods on the CAN bus.

Known systems detect faults at a message-receiving controller, with fault detection accomplished for the message using signal supervision and signal time-out monitoring at an interaction layer of the controller. Faults can be reported as a loss of communications, e.g., a loss of a communicated data message. Such detection systems generally are unable to identify a root cause of a fault, and are unable to distinguish transient and intermittent faults.

SUMMARY

A controller area network (CAN) includes a CAN bus having a CAN-H wire, a CAN-L wire, and a pair of CAN bus terminators located at opposite ends of the CAN bus. The CAN further includes a plurality of nodes including controllers wherein at least one of the controllers is a monitoring controller. The monitoring controller includes a detection control routine for isolating faults on the CAN bus including measuring a CAN-H wire voltage, measuring a CAN-L wire voltage, and isolating a short fault based upon the CAN-H wire voltage and the CAN-L wire voltage.

BRIEF DESCRIPTION OF THE DRAWINGS

One or more embodiments will now be described, by way of example, with reference to the accompanying drawings, in which:

FIG. 4-1 illustrates waveforms of voltage levels $V_H$ from the CAN-H bus wire and $V_L$ from the CAN-L bus wire when no faults are present, in accordance with the disclosure;

FIG. 4-2 illustrates waveforms of voltage levels $V_H$ from the CAN-H bus wire and $V_L$ from the CAN-L bus wire when a CAN open fault is present, in accordance with the disclosure;

FIG. 4-3 illustrates waveforms of voltage levels $V_H$ from the CAN-H bus wire and $V_L$ from the CAN-L bus wire when a CAN-H-CAN-L short is present, in accordance with the disclosure;

FIG. 4-4 illustrates waveforms of voltage levels $V_H$ from the CAN-H bus wire and $V_L$ from the CAN-L bus wire when a CAN-H short to ground fault is present, in accordance with the disclosure;

FIG. 4-5 illustrates waveforms of voltage levels $V_H$ from the CAN-H bus wire and $V_L$ from the CAN-L bus wire when a CAN-L short to ground fault is present, in accordance with the disclosure;

FIG. 4-6 illustrates waveforms of voltage levels $V_H$ from the CAN-H bus wire and $V_L$ from the CAN-L bus wire when a CAN-H short to power fault is present, in accordance with the disclosure; and FIG. 4-7 illustrates waveforms of voltage levels $V_H$ from the CAN-H bus wire and $V_L$ from the CAN-L bus wire when a CAN-L short to power fault is present, in accordance with the disclosure.

DETAILED DESCRIPTION

Figure 1:
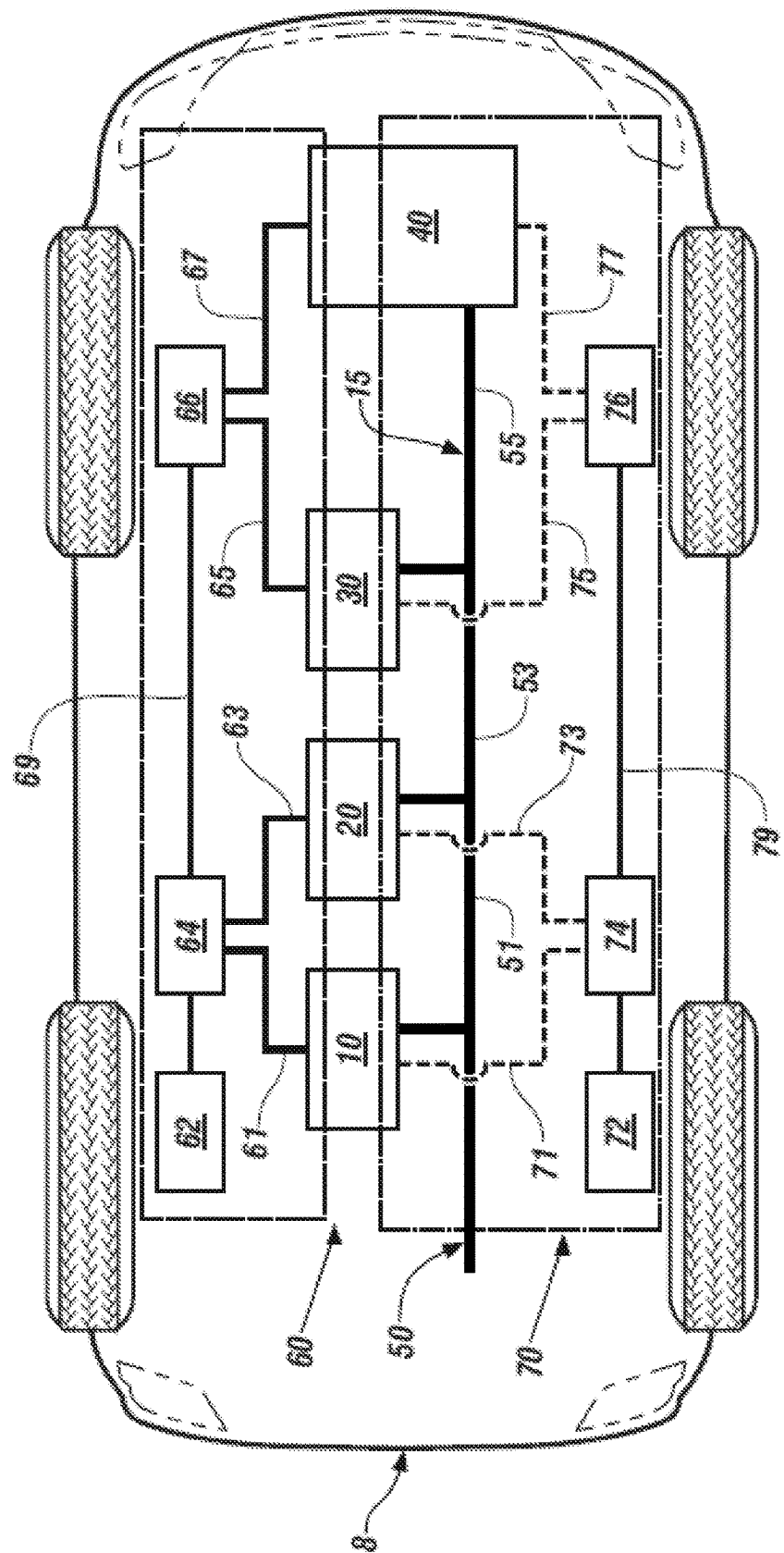
FIG. 1 illustrates a vehicle including a controller area network (CAN) with a CAN bus and a plurality of nodes, e.g., controllers, in accordance with the disclosure.

Referring now to the drawings, wherein the showings are for the purpose of illustrating certain exemplary embodiments only and not for the purpose of limiting the same, FIG. 1 illustrates a vehicle 8 including a controller area network (CAN) 50 including a CAN bus 15 and a plurality of nodes, i.e., controllers 10, 20, 30 and 40. The term "node" refers to any active electronic device that signally connects to the CAN bus 15 and is capable of sending, receiving, or forwarding information over the CAN bus 15. Each of the controllers 10, 20, 30 and 40 signally connects to the CAN bus 15 and electrically connects to a power grid 60 and a ground grid 70. Each of the controllers 10, 20, 30 and 40 includes an electronic controller or other on-vehicle device that is configured to monitor or control operation of a subsystem of the vehicle 8 and communicate via the CAN bus 15. In one embodiment, one of the controllers, e.g., controller 40, is configured to monitor the CAN 50 and the CAN bus 15, and may be referred to herein as a CAN controller. The illustrated embodiment of the CAN 50 is a non-limiting example of a CAN, which may be employed in any of a plurality of system configurations.

The CAN bus 15 includes a plurality of communications links, including a first communications link 51 between controllers 10 and 20, a second communications link 53 between controllers 20 and 30, and a third communications link 55 between controllers 30 and 40. The power grid 60 includes a power supply 62, e.g., a battery that electrically connects to a first power bus 64 and a second power bus 66 to provide electric power to the controllers 10, 20, 30 and 40 via power links. As shown, the power supply 62 connects to the first power bus 64 and the second power bus 66 via power links that are arranged in a series configuration, with power link 69 connecting the first and second power buses 64 and 66. The first power bus 64 connects to the controllers 10 and 20 via power links that are arranged in a star configuration, with power link 61 connecting the first power bus 64 and the controller 10 and power link 63 connecting the first power bus 64 to the controller 20. The second power bus 66 connects to the controllers 30 and 40 via power links that are arranged in a star configuration, with power link 65 connecting the second power bus 66 and the controller 30 and power link 67 connecting the second power bus 66 to the controller 40. The ground grid 70 includes a vehicle ground 72 that connects to a first ground bus 74 and a second ground bus 76 to provide electric ground to the controllers 10, 20, 30 and 40 via ground links. As shown, the vehicle ground 72 connects to the first ground bus 74 and the second ground bus 76 via ground links that are arranged in a series configuration, with ground link 79 connecting the first and second ground buses 74 and 76. The first ground bus 74 connects to the controllers 10 and 20 via ground links that are arranged in a star configuration, with ground link 71 connecting the first ground bus 74 and the controller 10 and ground link 73 connecting the first ground bus 74 to the controller 20. The second ground bus 76 connects to the controllers 30 and 40 via ground links that are arranged in a star configuration, with ground link 75 connecting the second ground bus 76 and the controller 30 and ground link 77 connecting the second ground bus 76 to the controller 40. Other topologies for distribution of communications, power, and ground for the controllers 10, 20, 30 and 40 and the CAN bus 15 can be employed with similar effect.

Control module, module, control, controller, control unit, processor and similar terms mean any one or various combinations of one or more of Application Specific Integrated Circuit(s) (ASIC), electronic circuit(s), central processing unit(s) (preferably microprocessor(s)) and associated memory and storage (read only, programmable read only, random access, hard drive, etc.) executing one or more software or firmware programs or routines, combinational logic circuit(s), input/output circuit(s) and devices, appropriate signal conditioning and buffer circuitry, and other components to provide the described functionality. Software, firmware, programs, instructions, routines, code, algorithms and similar terms mean any instruction sets including calibrations and look-up tables. The control module has a set of control routines executed to provide the desired functions. Routines are executed, such as by a central processing unit, and are operable to monitor inputs from sensing devices and other networked control modules, and execute control and diagnostic routines to control operation of actuators. Routines may be executed at regular intervals, for example each 100 microseconds, 3.125, 6.25, 12.5, 25 and 100 milliseconds during ongoing engine and vehicle operation. Alternatively, routines may be executed in response to occurrence of an event.

Each of the controllers 10, 20, 30 and 40 transmits and receives messages across the CAN 50 via the CAN bus 15, with message transmission rates occurring at different periods for different ones of the controllers. A CAN message has a known, predetermined format that includes, in one embodiment, a start of frame (SOF), an identifier (11-bit identifier), a single remote transmission request (RTR), a dominant single identifier extension (IDE), a reserve bit (r0), a 4-bit data length code (DLC), up to 64 bits of data (DATA), a 16-bit cyclic redundancy check (CRC), 2-bit acknowledgement (ACK), a 7-bit end-of-frame (EOF) and a 3-bit interframe space (IFS). A CAN message can be corrupted, with known errors including stuff errors, form errors, ACK errors, bit 1 errors, bit 0 errors, and CRC errors. The errors are used to generate an error warning status including one of an error-active status, an error-passive status, and a bus-off error status. The error-active status, error-passive status, and bus-off error status are assigned based upon increasing quantity of detected bus error frames, i.e., an increasing bus error count. Known CAN bus protocols include providing network-wide data consistency, which can lead to globalization of local errors. This permits a faulty, non-silent controller to corrupt a message on the CAN bus 15 that originated at another of the controllers. A faulty, non-silent controller is referred to herein as a fault-active controller. When one of the controllers is assigned the bus-off error status, it is prohibited from communicating on the CAN bus for a period of time. This includes prohibiting the affected controller from receiving messages and from transmitting messages until a reset event occurs, which can occur after an elapsed period of time when the controller is inactive. Thus, when a fault-active controller is assigned the bus-off error state, it is prohibited from communicating on the CAN bus for a period of time, and is unable to corrupt other messages on the CAN bus during the period of time when it is inactive.

Figure 2:
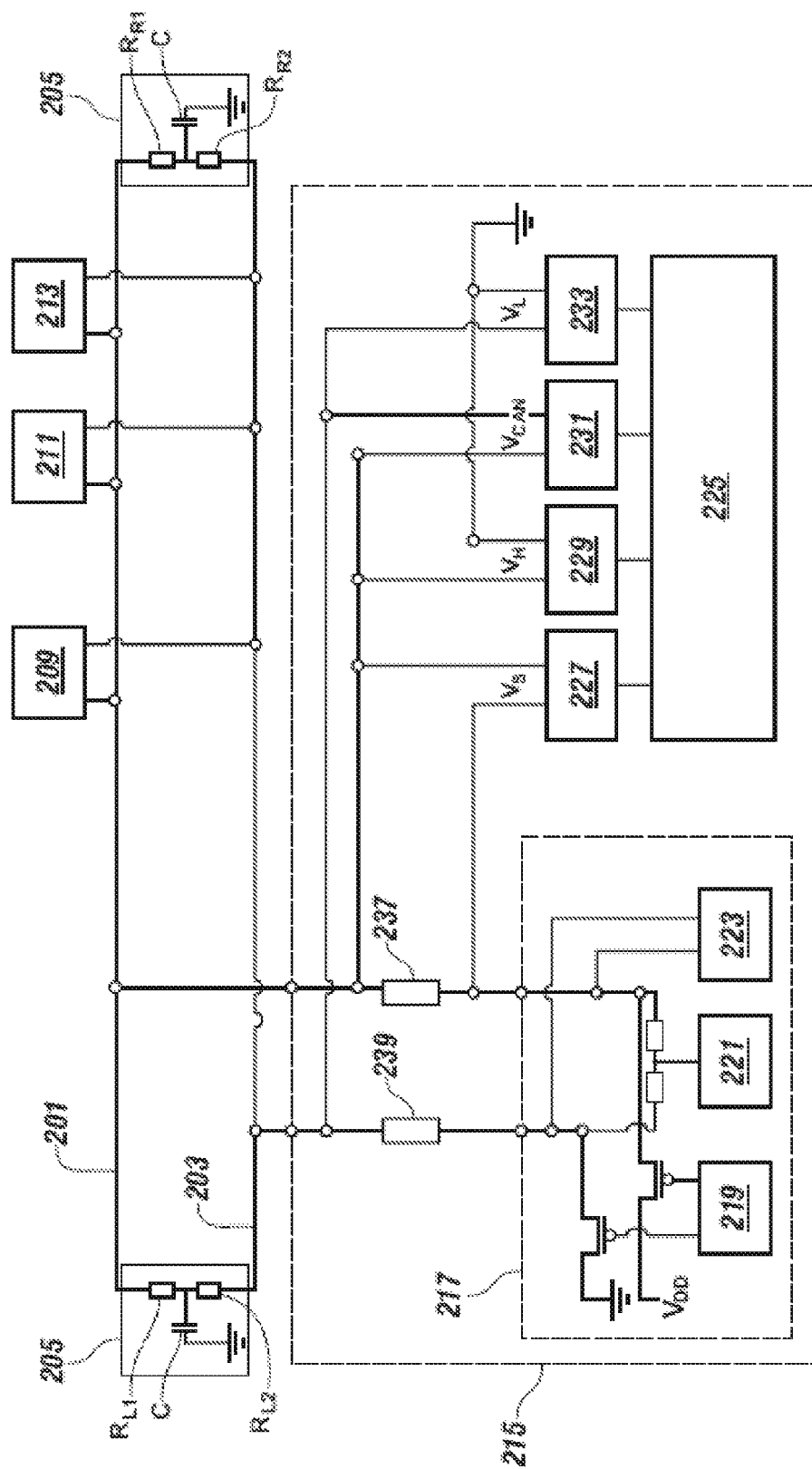
FIG. 2 illustrates an integrated controller area network similar to the CAN of FIG. 1, including a plurality of nodes, e.g., controllers, a monitoring controller, and a two-wire CAN bus including wire cables CAN-H and CAN-L electrically connected between terminators in a split termination configuration in accordance with the disclosure.

FIG. 2 illustrates one embodiment of an integrated controller area network similar to the CAN shown with reference to FIG. 1, including a two-wire CAN bus including wire cables CAN-H 201 and CAN-L 203 electrically connected between terminators 205, 207 in a split termination configuration. Each of the terminators electrically connects to ground via a respective pair of resistors and a respective capacitive element. The resistors in each pair are in series and the pair is coupled at one end to the CAN-H wire and at the other end to the CAN-L wire. The terminator to the left in the figure is labeled with upper and lower resistors $R_{L1}$ and $R_{L2}$, whereas the terminator to the right in the figure is labeled with upper and lower resistors $R_{R1}$ and $R_{R2}$. Upper resistors $R_{L1}$ and $R_{R1}$ each couple to the CAN-H bus wire at opposite ends of the bus, whereas lower resistors $R_{L2}$ and $R_{R2}$ each couple to the CAN-L bus wire at opposite ends of the bus. The capacitors in each terminator are labeled C and are coupled between ground and the node between the respective pair of resistors. Thus in the split configuration termination each terminator has a total resistance equal to the series combination of the respective pairs of upper and lower resistors. And, the total CAN bus resistance (i.e.

between CAN-H wire and CAN-L wire) is substantially equal to the termination resistances of the terminators in parallel. In one embodiment all of the terminator resistors are equivalent having a value of 60 ohms, and the capacitive elements are equivalent having a value of 4.7 nF. Thus each terminator has a total resistance equal to 120 ohms And, the total CAN bus resistance (i.e. between CAN-H wire and CAN-L wire) is substantially equal to 60 ohms Alternative configurations are envisioned wherein the total resistance of each terminator is equivalent to the other but the upper and lower resistors each have a different value. Alternative configurations are envisioned wherein the total resistance of each terminator is equivalent to the other, the upper resistors are equivalent to each other, the lower resistors are equivalent to each other, but the upper and lower resistors are not equivalent to each other. In any envisioned alternative, it may be desirable that the total CAN bus resistance (i.e. between CAN-H wire and CAN-L wire) is substantially equal to 60 ohms or some other industry standard. The split termination configuration improves electromagnetic compatibility by eliminating common-mode errors.

A plurality of nodes, e.g., controllers ECU1 209, ECU2 211, ECU3 213 and ECU-M 215 signally connect to the CAN. As shown, ECU-M 215 is a monitoring controller. Each of the controllers may be capable of monitoring and providing the same or similar diagnostic functionality as that described with respect to ECU-M 215.

The monitoring controller ECU-M 215 includes a CAN transceiver device 217 including a signal transmitter 219, a bias control 221 and a receiver 223 that signally connect to the wire cables CAN-H 201 and CAN-L 203 of the CAN bus via first and second shunt resistors ($R_S1$ 237, $R_S2$ 239), respectively. The first and second shunt resistors are high-precision, low impedance devices each preferably having a value at or near 1.0 ohm and preferably of the same resistance value. The monitoring controller ECU-M 215 also includes a microcontroller (MCU) 225 that signally connects to a plurality of analog-to-digital converters (ADC1 227, ADC2 229, ADC3 231, ADC4 233) and a plurality of executable control routines.

As shown in one embodiment, ADC1 227 is electrically configured to monitor a voltage ($V_S$) across $R_S1$ 237, ADC2 229 is electrically configured to monitor a voltage ($V_H$) between the CAN-H 201 wire and an electrical ground, ADC3 231 is electrically configured to monitor a voltage ($V_{CAN}$) between the CAN-H 201 wire and the CAN-L 203 wire of the communications bus, and ADC4 233 is electrically configured to monitor a voltage ($V_L$) between the CAN-L 203 wire and the ground. ADC1 227 and ADC3 231 and the related measurements are optional.

Figure 3:
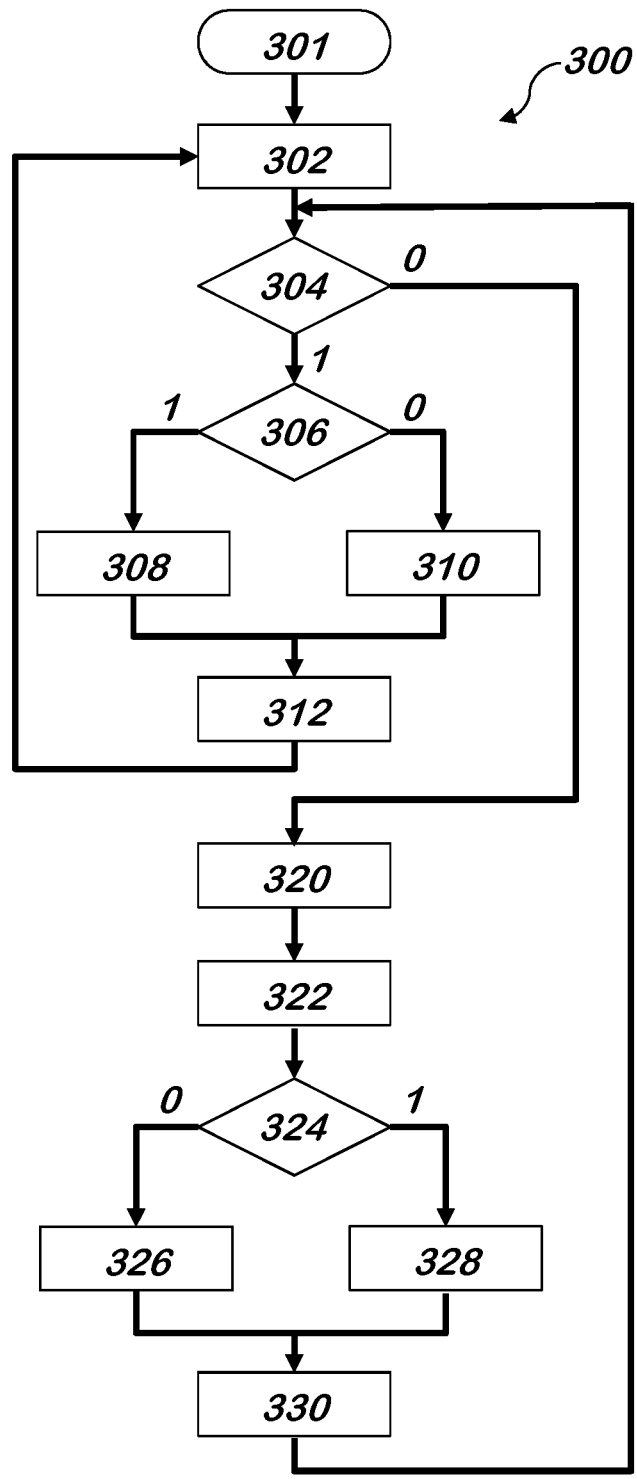
FIG. 3 illustrates an exemplary short fault detection and isolation routine 300 for monitoring a two-wire CAN, including both the two-wire CAN bus including wire cables CAN-H and CAN-L electrically connected between terminators in a split termination configuration described in FIG. 2, in accordance with the disclosure.
Figures 1, 4:
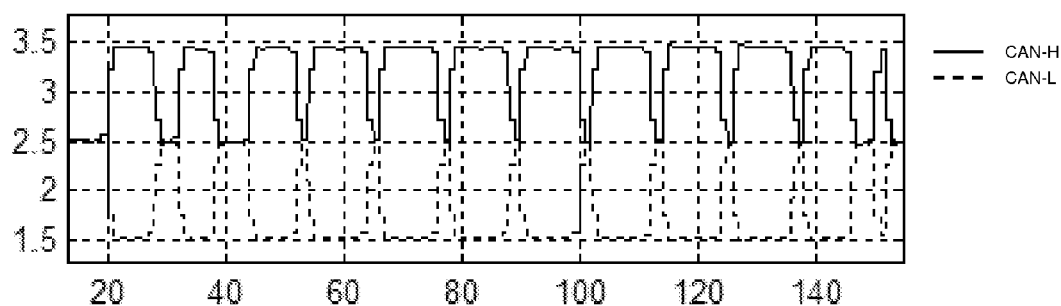
Figures 2, 4:
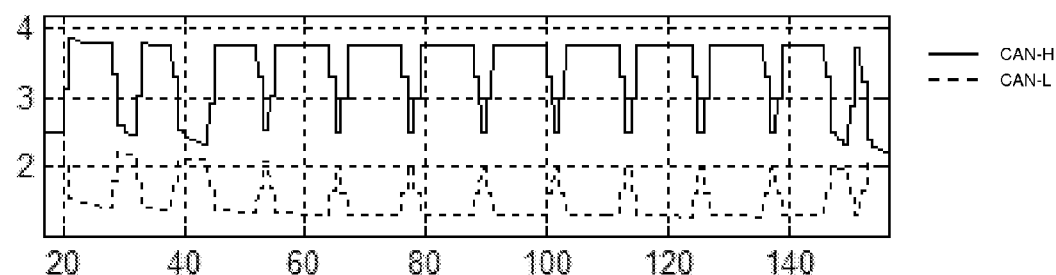
Figures 3, 4:
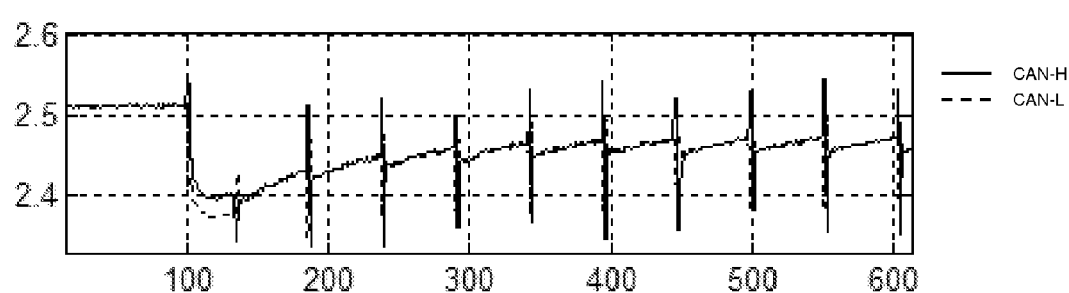
Figure 4:
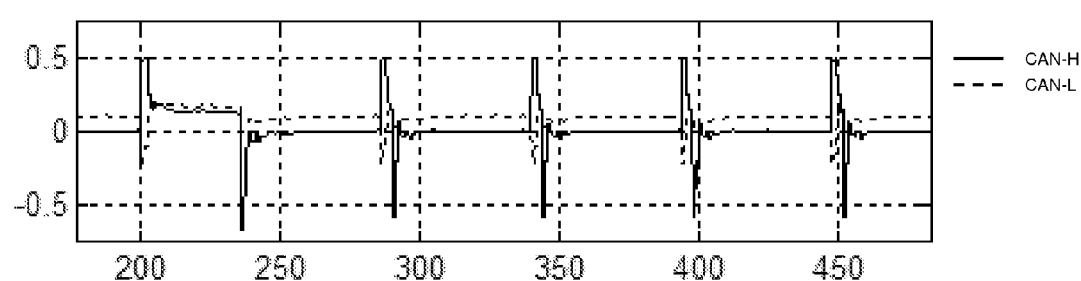
Figures 4, 5:
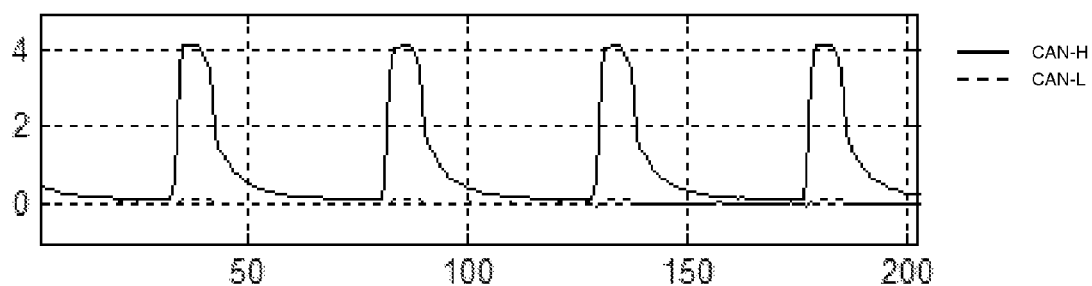
Figures 4, 5, 6:
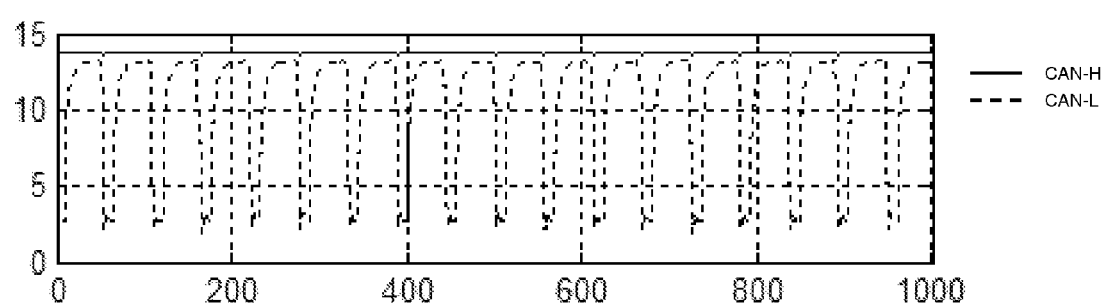
Figures 4, 5, 6, 7:
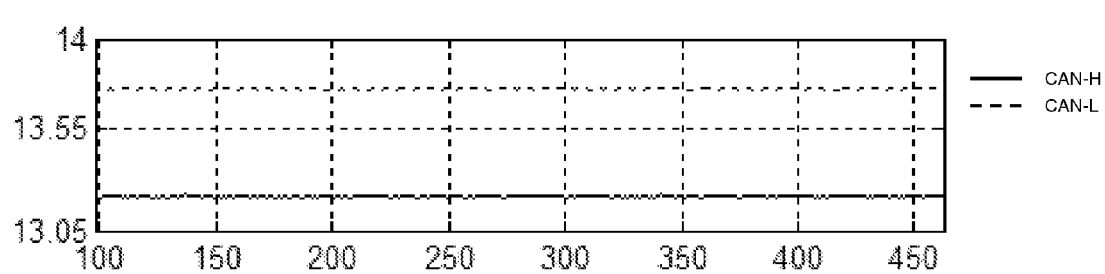

FIGS. 4-1 through 4-7 show a plurality of data graphs associated with signal communications across the CAN bus including waveforms of voltage levels $V_H$ from the CAN-H bus wire and $V_L$ from the CAN-L bus wire. Such data graphs are useful in understanding the various CAN bus faults and resultant voltages as shown in Table 1. FIG. 4-1 shows datagraphs including waveforms of voltage levels $V_H$ from the CAN-H bus wire and $V_L$ from the CAN-L bus wire when no faults are present. FIG. 4-2 shows datagraphs including waveforms of voltage levels $V_H$ from the CAN-H bus wire and $V_L$ from the CAN-L bus wire when a CAN open fault is present. FIG. 4-3 shows datagraphs including waveforms of voltage levels $V_H$ from the CAN-H bus wire and $V_L$ from the CAN-L bus wire when a CAN-L to CAN-L short is present. FIG. 4-4 shows datagraphs including waveforms of voltage levels $V_H$ from the CAN-H bus wire and $V_L$ from the CAN-L bus wire when a CAN-H short to ground fault is present. FIG. 4-5 shows datagraphs including waveforms of voltage levels $V_H$ from the CAN-H bus wire and $V_L$ from the CAN-L bus wire when a CAN-L short to ground fault is present. FIG. 4-6 shows datagraphs including waveforms of voltage levels $V_H$ from the CAN-H bus wire and $V_L$ from the CAN-L bus wire when a CAN-H short to power fault is present. FIG. 4-7 shows datagraphs including waveforms of voltage levels $V_H$ from the CAN-H bus wire and $V_L$ from the CAN-L bus wire when a CAN-L short to power fault is present.

Voltage levels for CAN-H voltage $V_H$ and for CAN-L voltage $V_L$ corresponding to various CAN bus faults are shown in Table 1 which is built using empirical data from actual CAN bus hardware, from design data, or a combination of those sources. Table 1 is useful in analyzing various absolute and comparative voltage combinations against predetermined characteristics exhibited for the variety of short faults, and deriving therefrom unique combinations of tests corresponding to each such short fault and useful in short fault isolation.

TABLE 1

| FIG. No | Fault-type | $V_L$ (V) | $V_H$ (V) | Resistance (ohms) |
|---|---|---|---|---|
| 4-1 | Normal | 1.5 to 2.5 | 2.5 to 3.5 | 60 |
| 4-2 | CAN Open | Type-dependent | Type-dependent | 120 |
| 4-3 | CAN-H/CAN-L Short | 2.2 to 2.5 | 2.4 to 2.6 | Distance related 0 to 4.0 |
| 4-4 | CAN-H short to Ground | −0.5 to 0.0 | 0.0 to 0.5 | 0 to 2.0 |
| 4-5 | CAN-L short to Ground | 0 | 0.0 to 4.0 | N/A |
| 4-6 | CAN-H short to Power | 2 to 13.2 | 13.8 | N/A |
| 4-7 | CAN-L short to Power | 13.8 | 13.2 | N/A |

The voltage ($V_H$) and the voltage ($V_L$) are provided to a set of tests or comparisons of the individual voltages or certain combinations of the voltages. Each test is either a pass or fail with respect to the tests or comparisons performed on the individual or combinational voltages. Each test is indicative of a certain characteristic that is useful in combination with certain others of the tests in isolating CAN bus faults. Various such combinations of such tests provide a signature of a corresponding CAN bus fault. These various tests and CAN bus faults can be modeled as a two-dimensional array or fault signature matrix, an example of which is set forth in Table 2, which represents mutually exclusive combinations various tests upon CAN-H and CAN-L voltages. Such a fault signature matrix is preferably encoded for reference or execution in the monitoring controller with the CAN-H voltage $V_H$ and for CAN-L voltage $V_L$ input and determination of CAN faults being output.

Exemplary tests are described with reference to Table 2, and include comparison of $V_L$ from the CAN-L bus wire with a range between 1 and 5 volts ($1<V_L<5$), comparison of $V_H$ from the CAN-H bus wire at or near battery voltage ($V_H>V_{bat}-2V$), comparisons of $V_L$ from the CAN-L bus wire at or near ground ($V_L<0.2V$), comparisons of $V_H$ from the CAN-H bus wire falling between 1 and 5 volts ($1<V_H<5$), and comparisons of $V_H$ from the CAN-H bus wire being between 3V to 5 V simultaneous with a difference between $V_H$ from the CAN-H bus wire and $V_L$ from the CAN-L bus wire being greater than 0.5 volt ($3<V_H<5$ and $|V_H-V_L|>0.5$). The voltages and their differential associated with the various fault-types are examples for a specific system, and may vary depending upon details of an electrical configuration for a specific system. The voltage levels $V_H$ from the CAN-H bus wire and $V_L$ from the CAN-L bus wire under normal operation and in the presence of each of the faults are characterized to distinguish the faults and establish a short fault signature matrix based upon $V_H$ and $V_L$. Additional faults (i.e. open faults) may be added to the matrix with additional CAN bus resistance data. Analysis of the voltage levels $V_H$ from the CAN-H bus wire and $V_L$ from the CAN-L bus wire leads to isolation of short faults to a specific fault-type.

TABLE 2

| Fault-type | $1 < V_L < 5$ | $V_H >$ Vbat-2 (%) | $V_L < 0.2$ (%) | $1 < V_H < 5$ (%) | $3 < V_H < 5$ and $|V_H - V_L| > 0.5$ | Resistance ($\Omega$) |
|---|---|---|---|---|---|---|
| Normal | — | | <1% | <1% | — | >10 bits in every 60/L bits | ~60 |
| CAN Open | — | | <1% | <1% | — | >10 bits in every 60/L bits | ~120 |
| CAN-H/CAN-L Short | — | | <1% | <1% | — | <1% | 0 to 4 |
| CAN-H short to Ground | — | | <1% | 99% | <1% | — | 0 to 2 |
| CAN-L short to Ground | — | | <1% | 99% | >1 bit in every 25 bits | — | — |
| CAN-H short to Power | >1 bit in every 25 bits | | >99% | <1% | — | — | — |
| CAN-L short to Power | <1% | | >99% | <1% | — | — | — |

FIG. 3 illustrates an exemplary short fault detection and isolation routine 300 for monitoring a two-wire CAN, including both the two-wire CAN bus including wire cables CAN-H and CAN-L electrically connected between terminators in a split termination configuration. The routine 300 is executed as one or more control routines in the monitoring controller. Table 3 is provided as a key to the short fault detection and isolation routine 300 of FIG. 3, wherein the numerically labeled blocks and the corresponding functions are set forth as follows.

TABLE 3

| BLOCK | BLOCK CONTENTS |
|---|---|
| 301 | Start |
| 302 | Initialize Sampling Counter |
| 304 | Is Sampling Counter ≥ $N_1$? |
| 306 | Are fault-types generated in $N_2$ of $N_1$ iterations the same? |
| 308 | Verify fault-type |
| 310 | Fault is not able to be isolated |
| 312 | Save fault-type result |
| 320 | Collection continuous 60/L bits |
| 322 | Count quantity of data points falling into each of a plurality of windows of a fault signature matrix |
| 324 | Is any set of fault matrix conditions met? |
| 326 | Fault-type is not able to be isolated |
| 328 | Identify fault-type |
| 330 | Increment counter |

Upon initiation of the short fault detection and isolation routine 300 (301), a sampling counter is initialized (302) and compared to a sampling iterations threshold number ($N_1$) (304), which has a numeric value of 5 in one embodiment. When the sampling counter is less than threshold $N_1$ (304) (0), CAN bus parameters (e.g. voltage data from the communication bus) are continuously measured, collected or otherwise derived (320) to obtain a suitable sample size. Sample size preferably is inversely related to bus load "L" (%) to ensure sufficient sampling at low or marginal bus loads. In one embodiment the sample size is set at 60/L bits which would result in a minimum of 60 bit samples or data points at 100% bus load. A sampling iteration includes continuously monitoring voltage ($V_H$) between the first of the wires of the communications bus (CAN-H) and ground and monitoring voltage ($V_L$) between the second of the wires of the communications bus (CAN-L) and ground. Sampling data points may also include measuring other CAN bus parameters or calculating or deriving additional CAN bus parameters from measured parameters. For example, CAN bus resistance can readily be derived from voltage measurements. Preferably for filtering and data confidence, counting the data points falling into each of a plurality of the tests or windows of a fault signature matrix (322) is performed. As previously mentioned, the individual tests are either pass or fail. However, since sampling is envisioned as being invoked during communication operability of the CAN bus and for robust diagnosis and confidence, test passes are accumulated for each test in a pass count and arbitrary or statistically significant thresholds or count requirements for pass counts are associated with each test. Meeting these thresholds or count requirements signifies a count correspondence for a passed test. A fault-type is therefore indicated when all tests making up the corresponding fault signature exhibit count correspondence (324). If there is a count correspondence for a fault-type (324)(1), the routine generates or indicates the fault-type (328) and the sampling counter increments (330). If there is no such correspondence to any of the fault-types (324)(0), the routine indicates that a fault-type cannot be isolated during this sampling iteration (326) and the sampling counter increments (330). Continued execution of this portion of the routine is repeated by evaluating the sampling counter (304).

When the sampling counter is greater than or equal to threshold $N_1$ (304)(1), the results are evaluated to determine whether they are the same for a predetermined number ($N_2$) of the $N_1$ sampling iterations (306). In one embodiment, $N_1$ has a value of 5 sampling iterations, and $N_2$ has a value of 4 sampling iterations. When $N_2$ of the $N_1$ sampling iterations have generated the same fault-type (306)(1), the isolated fault-type is generated (308), and the isolation result is saved (312). When less than $N_2$ of the $N_1$ sampling iterations are the same (306)(0), the isolated fault-type is presently unable to be generated (310), and this result is saved (312).

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The invention claimed is:

1. A controller area network (CAN) comprising:
   a CAN bus including a CAN-H wire and a CAN-L wire;
   a pair of CAN bus terminators located at opposite ends of the CAN bus, each terminator having a corresponding known terminator resistance value;
   a plurality of nodes including controllers wherein at least one of said controllers comprises a monitoring controller; and
   said monitoring controller comprising a detection control routine for identifying fault-types on the CAN bus, comprising the following steps:
      determining a set of CAN bus parameters; and
      identifying fault-types based upon the CAN bus parameters;
   wherein said set of CAN bus parameters comprises a CAN-H wire voltage and a CAN-L wire voltage, and said fault-types comprise CAN bus short faults; and
   wherein the step of identifying fault-types based upon the CAN bus parameters comprises the following steps:
      comparing the CAN-H wire voltage, the CAN-L wire voltage and a voltage differential between the CAN-H wire voltage and the CAN-L wire voltage to a predetermined set of criteria defining a plurality of fault signatures corresponding to respective fault-types;
      identifying fault-types when said comparison matches one of the fault signatures.

2. A controller area network (CAN) comprising:
   a CAN bus including a CAN-H wire and a CAN-L wire;
   a pair of CAN bus terminators located at opposite ends of the CAN bus, each terminator having a corresponding known terminator resistance value;
   a plurality of nodes including controllers wherein at least one of said controllers comprises a monitoring controller; and
   said monitoring controller comprising a detection control routine for identifying fault-types on the CAN bus, comprising the following steps:
      determining a set of CAN bus parameters; and
      identifying fault-types based upon the CAN bus parameters;
   wherein said set of CAN bus parameters comprises a CAN-H wire voltage and a CAN-L wire voltage, and said fault-types comprise CAN bus short faults; and
   wherein the steps of determining a set of CAN bus parameters comprises taking a predetermined number of measurements of the CAN-H wire voltage and the CAN-L wire voltage; and
   wherein the step of identifying fault-types based upon the CAN bus parameters comprises:
      providing each measurement of CAN-H wire voltage and the CAN-L wire voltage to a predetermined fault signature matrix comprising a set of predetermined tests and predetermined combinations of said tests comprising respective CAN bus fault signatures;
      for each test, counting a respective number of tests passed;
      for each CAN bus fault signature, evaluating the number of tests passed for each test against a respective predetermined count correspondence threshold; and
      outputting from said matrix an identification of a fault-type corresponding to any evaluation where each count correspondence threshold is attained for every relevant test.

3. The controller area network (CAN) of claim 1, wherein the step of determining a set of CAN bus parameters comprises the following step:
   sampling a predetermined number of data points comprising a respective CAN-H wire voltage and a respective CAN-L wire voltage.

4. A controller area network (CAN) comprising:
   a CAN bus including a CAN-H wire and a CAN-L wire;
   a pair of CAN bus terminators located at opposite ends of the CAN bus, each terminator having a corresponding known terminator resistance value;
   a plurality of nodes including controllers wherein at least one of said controllers comprises a monitoring controller; and
   said monitoring controller comprising a detection control routine for identifying fault-types on the CAN bus, comprising the following steps:
      determining a set of CAN bus parameters; and
      identifying fault-types based upon the CAN bus parameters;
   wherein said set of CAN bus parameters comprises a CAN-H wire voltage and a CAN-L wire voltage, and said fault-types comprise CAN bus short faults;
   wherein the step of determining a set of CAN bus parameters comprises the following step:
      sampling a predetermined number of data points comprising a respective CAN-H wire voltage and a respective CAN-L wire voltage; and
   wherein the step of identifying fault-types based upon the CAN bus parameters comprises the following steps:
      subjecting the data points to a set of pass/fail tests;
      for each test, producing a pass count;
      for each fault-type, evaluating the pass counts against respective count requirements; and
      identifying the fault-type when all respective count requirements corresponding to the fault-type are satisfied.

5. The controller area network (CAN) of claim 3, wherein said predetermined number of data points is inversely proportional to a CAN bus load.

6. The controller area network (CAN) of claim 4, wherein said predetermined number of data points is inversely proportional to a CAN bus load.

7. A controller area network (CAN) comprising:
   a CAN bus including a CAN-H wire and a CAN-L wire;

a pair of CAN bus terminators located at opposite ends of the CAN bus, each terminator having a corresponding known terminator resistance value;

a plurality of nodes including controllers wherein at least one of said controllers comprises a monitoring controller; and said monitoring controller comprising a control routine for identifying a plurality of fault-types on the CAN bus, comprising the following steps:

sampling a predetermined number of data points comprising a respective CAN-H wire voltage and a respective CAN-L wire voltage;

subjecting the data points to a set of pass/fail tests;

for each test, producing a pass count;

for each fault-type, evaluating the pass counts against respective count requirements; and identifying the fault-type when all respective count requirements corresponding to the fault-type are satisfied.

8. The controller area network (CAN) of claim 7, wherein said predetermined number of data points is inversely proportional to a CAN bus load.

9. A controller area network (CAN) comprising:

a CAN bus including a CAN-H wire and a CAN-L wire;

a pair of CAN bus terminators located at opposite ends of the CAN bus, each terminator having a corresponding known terminator resistance value;

a plurality of nodes including controllers wherein at least one of said controllers comprises a monitoring controller; and said monitoring controller comprising a control routine for identifying a plurality of fault-types on the CAN bus, comprising the following steps:

sampling a predetermined number of data points comprising predetermined CAN bus parameters;

subjecting the data points to a set of pass/fail tests;

for each test, producing a pass count;

for each fault-type, evaluating the pass counts against respective count requirements; and identifying the fault-type when all respective count requirements corresponding to the fault-type are satisfied.

10. The controller area network (CAN) of claim 9, wherein said predetermined CAN bus parameters comprise a CAN-H wire voltage, a CAN-L wire voltage and CAN bus resistance, and wherein said fault-types comprise CAN bus short faults and CAN bus open faults.

11. The controller area network (CAN) of claim 9, wherein said predetermined CAN bus parameters comprise a CAN-H wire voltage and a CAN-L wire voltage, and wherein said fault-types comprise CAN bus short faults.

12. The controller area network (CAN) of claim 9, wherein the said predetermined number of data points is inversely proportional to a CAN bus load.

* * * * *